United States Patent [19]

Wittke

[11] 4,276,512
[45] Jun. 30, 1981

[54] PHASE DETECTOR FOR PHASE LOCKED LOOPS

[75] Inventor: Ernest C. Wittke, West Caldwell, N.J.

[73] Assignee: The Singer Company, Little Falls, N.J.

[21] Appl. No.: 41,045

[22] Filed: May 21, 1979

[51] Int. Cl.³ ............................................ H03D 13/00
[52] U.S. Cl. .................................... 328/133; 328/155; 331/1 A; 331/27
[58] Field of Search .......................... 331/1 A, 25, 27; 307/232; 328/133, 134, 155

[56] References Cited

U.S. PATENT DOCUMENTS

| | | | |
|---|---|---|---|
| 3,657,659 | 4/1972 | Johnson | 328/133 |
| 3,723,889 | 3/1973 | Oberst | 328/134 |
| 3,989,931 | 11/1976 | Phillips | 328/134 X |

Primary Examiner—Siegfried H. Grimm
Attorney, Agent, or Firm—Laurence A. Wright; Thomas W. Kennedy

[57] ABSTRACT

A phase locked loop circuit employing a first edge detector consisting of an exclusive OR gate and flip flop circuit feeding by way of a NAND gate, an up counter and a second edge detector of like kind feeding also by way of a NAND gate into a down counter. Both counters feed into an added which provides a signal to a decoder representing the phase difference between the input phase and the output phase signal. The phase processing system provides positive rapid pull-in over the entire frequency range capability of the VCO, which allows narrow bandwidth loops to track rapid rates of frequency change without loss of lock and with great accuracy.

11 Claims, 7 Drawing Figures

PHASE DETECTOR FOR PHASE LOCKED LOOPS

The invention herein described was made in the course of or under a contract or subcontract thereunder, with the Department of the Navy.

This invention relates to a phase processing system. More particularly, this invention relates to an improved phase processing system which provides positive rapid pull-in over the entire frequency range capability of the voltage controlled oscillator and which allows narrow bandwidth loops to track with greater accuracy rapid rates of frequency change without loss of lock.

BACKGROUND OF THE INVENTION

Phase lock loops are currently in use in many control areas from speed and angular rate control mechanisms to communication systems which employ frequency tracking methods for FM reception. In all phase lock loop systems, a signal from a variable frequency oscillator is compared with a cyclical incoming signal in a phase detector. The output of the phase detector, which is nominally a voltage proportional to the phase angle between the incoming and feedback frequencies is amplified and applied as a command to a voltage controlled oscillator (VCO). The frequency of the VCO is normally higher than the incoming frequency, and is normally down counted by a factor of N to the nominal frequency range of the incoming signal and is applied as a reference to a mixer. In actuality, since the output of the counter, the VCO and the operation of the mixer tend to be rich in harmonics, the mixer output will contain harmonics of the incoming frequency in addition to the error signal. The harmonic signals are removed by a low pass filter.

Phase lock loops present design difficulties in three areas, namely, "pull-in", "tracking rate" and "hold in range." Of these characteristics, the hold in range is most straightforward. It is determined by the range of the oscillator and the integrator output and is a readily controlled design parameter. Tracking rate is limited by the bandwidth of the phase lock loop itself and, with conventional techniques, it may be impossible to achieve a desired frequency tracking rate at a given operating frequency and loop bandwidth. "Pull-in" presents the most severe problem in phase-lock loop design. In the event that the incoming and reference frequencies differ by an amount greater than the frequency change represented by a phase error of $\pi/2$ radians, the error signal from the phase detector is not large enough to bring the VCO to synchronize with the incoming frequency. Therefor, the frequency difference will remain and a cyclical output from the phase detector results, having virtually no DC level to build up a signal on the integrator.

BRIEF DESCRIPTION OF THE INVENTION

The phase processing system of the present invention provides an optional comparator for one of the inputs of the system. The comparator serves to convert the sinusoidal input into logic level signals. Another input to the system from the VCO is fed into an exclusive OR gate and flip flop circuit or edge detector. The output of the comparator is also fed into a separate edge detector. The two edge detectors produce short positive pulses when the input signal changes state. These positive pulses are then fed to two flip flop circuits which change their output state signal. The outputs from the edge detectors are applied to an up counter and to a down counter. The outputs from the two counters are then applied to an adder. The most significant bit (MSB) is the phase detector output to be used in the phase lock loop and is zero when the adder output is less than half its range and is 1 when it is above midrange. The output from the adder is applied to a decoder circuit to produce a zero to the NAND gate on the up counter whenever the count on the adder rises to a predetermined value and a zero to the NAND gate on the down counter whenever the count on the adder falls below a predetermined value.

A second embodiment of the invention substitutes a single UP/DOWN counter for the two counter and adder combination.

Accordingly, it is an object of this invention to provide a phase processing system having means for rapid pull-in over the entire frequency range of the voltage controlled oscillator and which allows narrow bandwidth loops to track with great accuracy rapid rates of frequency change without loss of lock.

This and other objects, features and advantages of the present invention will become apparent from the following description taken in conjunction with the accompanying drawings wherein.

Figure 1:
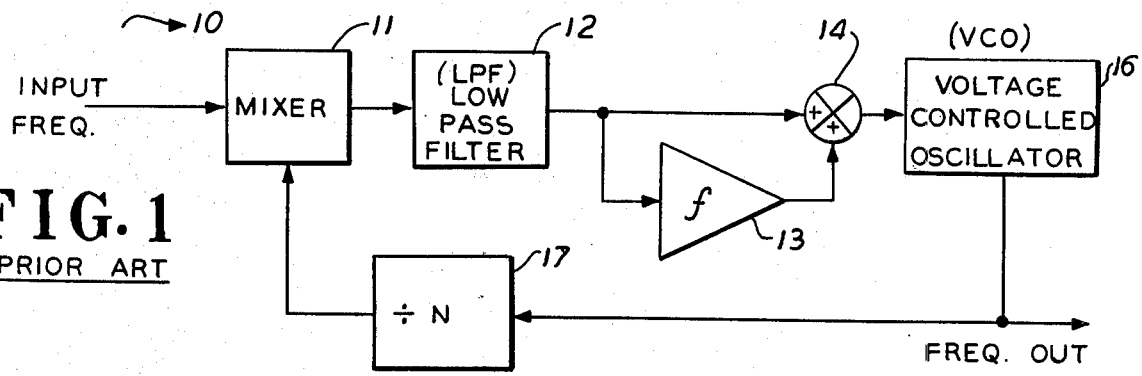
FIGS. 1 and 2 are prior art phase lock loops which are subject to signal loss.

Referring now to FIG. 1, there is shown generally at 10 a prior art phase lock loop. The incoming frequency signal is fed to mixer 11 where it is compared with an error signal from divider circuit 17. The output of the mixer is a voltage proportional to the phase angle between the incoming signal and the feedback signal. The harmonic signals from the mixer are removed by low pass filter 12. From the low pass filter the signal is fed to amplifier integrator 13 and summing network 14 and thence applied to voltage controlled oscillator 16. The frequency of the voltage controlled oscillator is normally down counted by a factor N in divider 17 to the nominal frequency range of the incoming signal and is applied as a reference to the mixer.

Figure 2:
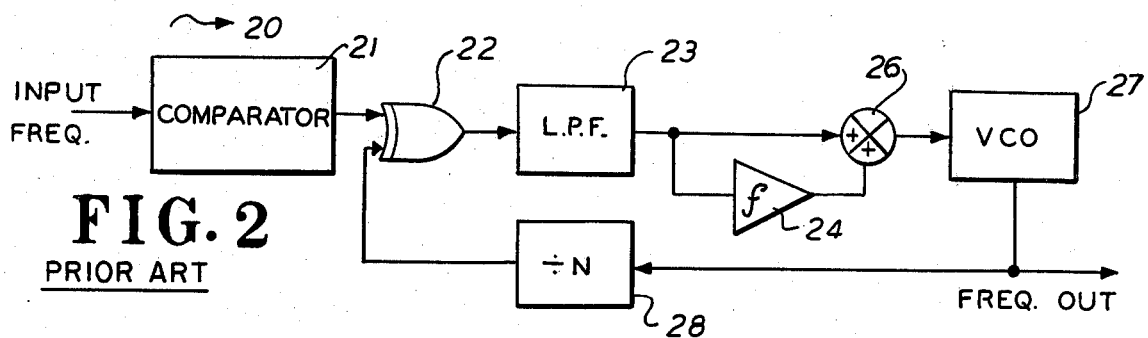

FIG. 2 is a prior art schematic of a common hardware implementation of phase lock loop circuit 20 which may be incorporated on a single chip making use of logic circuitry. In this diagram which typifies such systems, the incoming signal is fed to comparator 21, if not in TTL format, is converted to a logic level signal by the comparator. The voltage controlled oscillator 27 and the down counter 28 shown are logic level devices. Mixing is accomplished by an exclusive OR gate 22 to produce an error signal which is centered between a logic 1 and a logic 0. This signal is filtered, and shaped in filter 23 and amplified in integrator 24 and applied to the voltage controlled oscillator which has a command range between logic 0 and logic 1.

Figure 3:
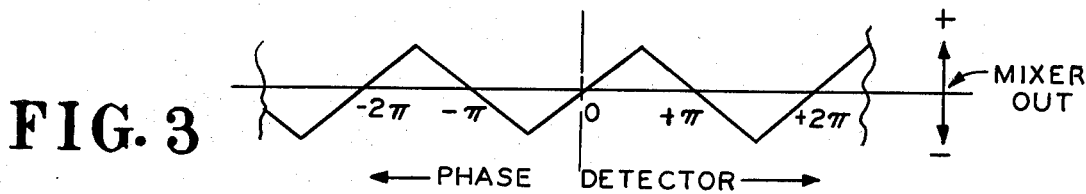
FIG. 3 shows the triangular output waveform from a phase lock loop of FIG. 2.

The output of the digital detector of FIG. 2 is shown in FIG. 3. After filtering to remove harmonics, it is a triangular signal which reverses direction every $\pi$ radians of phase difference between signals. As such, it is capable of "locking in" at phase errors of $\pm 2(N-1)\pi$ radians where N is a positive integer. In the absence of the integrator 24 shown in FIG. 2 the mixer 22 characteristic shown is capable of deviating the output frequency over a range represented by the peak positive to negative signals of the mixer as applied to the oscillator. The addition of the integrator provides, in addition to the elimination of static phase error, the ability to extend the operating frequency range of the system, to a degree limited only by the bias error shifts of the integrator, and the rate of change of the incoming frequency.

Phase lock loops of the prior art present design problems in the areas of "pull-in", "tracking rate" and "hold in range." Hold in range is determined by the range of the oscillator and the integrator output and is a readily controlled design parameter. Tracking rate is limited by the bandwidth of the phase locked loop itself and with conventional techniques it may be impossible to achieve a desired frequency tracking rate at a given operating frequency and loop bandwidth.

Figure 4:
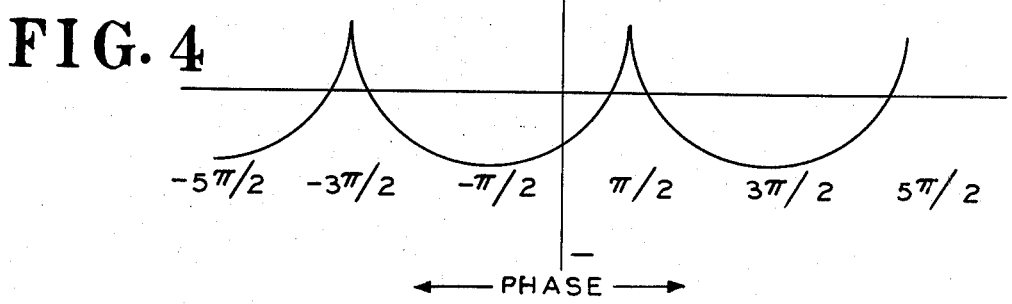
FIG. 4 shows the actual output waveform from the phase lock loop showing the distortion resulting from signal loss.

Pull-in presents the most severe problem in phase-lock loop design. In the event that the incoming and reference frequencies differ by an amount greater than the frequency change represented by a phase error of $\pi/2$ radians, the error signal from the phase detector is not large enough to bring the VCO to synchronize with incoming frequency. As a result, the frequency difference will remain and a cyclical output from the phase detector, having virtually no DC level to build up a signal on the integrator. In actuality, the detector output is a beat note between the incoming frequency and the controlled frequency which serves to modulate the controlled frequency. The resultant detector output is distorted from the triangular shape of FIG. 3 into the shape shown in FIG. 4 which does in fact have a DC level. This DC level drives the integrator in loops of order equal to 2 or more and causes the signal to the oscillator to eventually produce lock. Unfortunately, the distortion decreases with frequency error and the rate of change of frequency is lessened by greater frequency error. When the DC level resulting from the beat note is less than the detector and integrator drifts, pull-in will not occur. The nature of pull-in in a conventional loop means that for large frequency errors, an extremely long pull-in time can occur. Times in excess of an hour have been reported.

Figure 5:
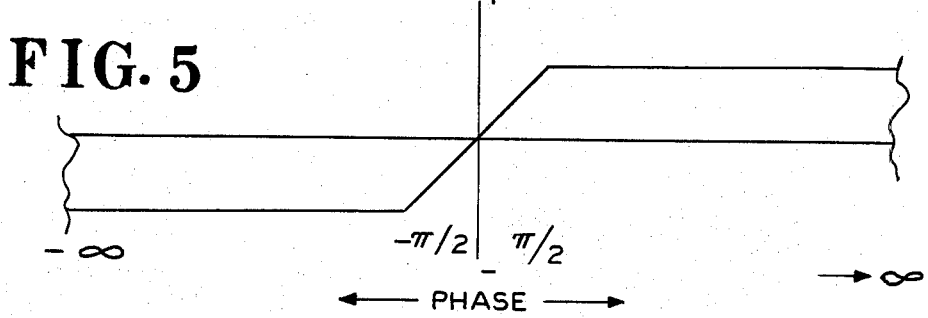
FIG. 5 shows the ideal output waveform which would be desired.

Ideally, the output of the phase detector would be as shown in FIG. 5. With such a detector, a frequency error results in phase error which drives toward plus or minus infinity and produces a full level signal which operates to drive the integrator towards the correct frequency. This is the result which is obtained, for example, in a loop which combines a phase detector and a frequency discriminator. Such a system is complex, particularly in the signal mixing and is difficult to apply where the incoming frequency is a variable.

Figure 6:
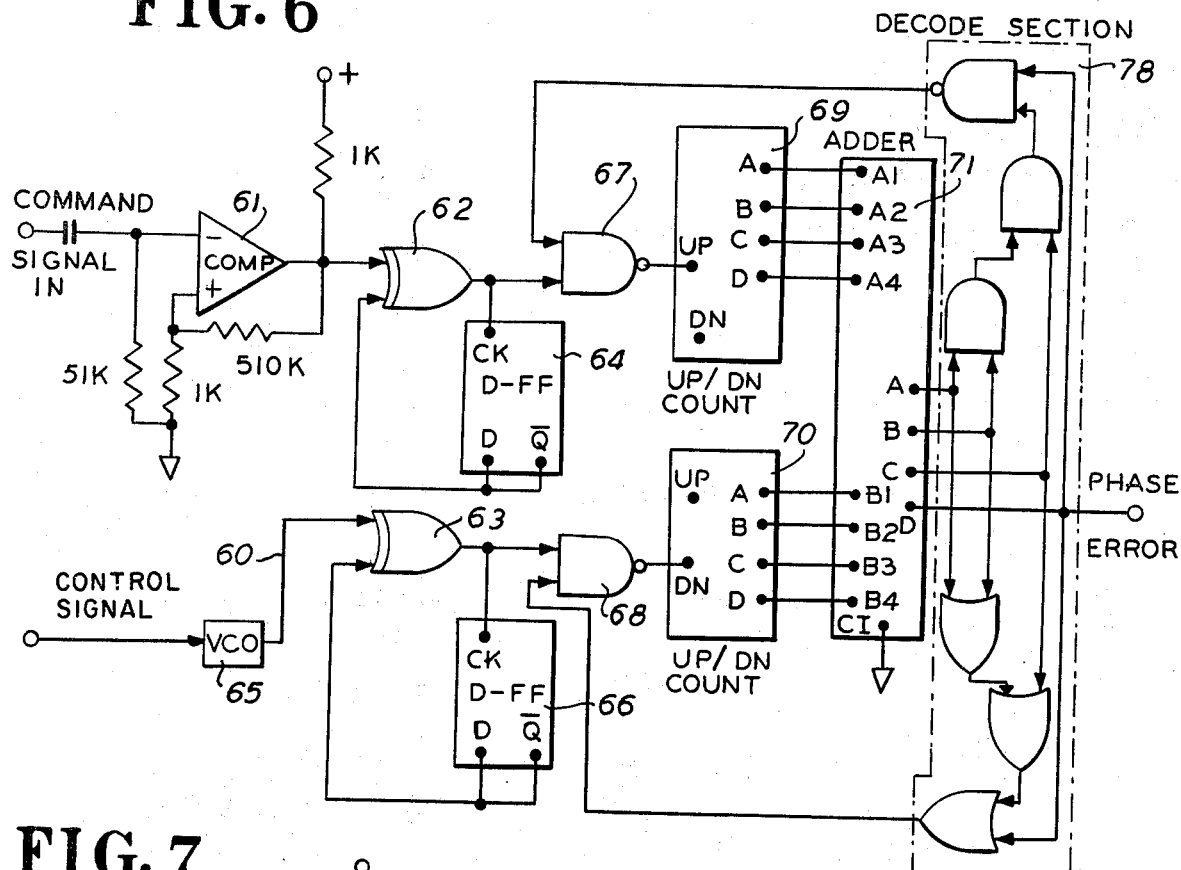
FIG. 6 is a circuit showing a first embodiment of the phase processing system of the invention which employs two separate counters and an adder.

Turning now to FIG. 6, there is shown an ideal phase detector for a phase lock loop in a first embodiment of the invention. This circuit provides an optional comparator 61 for one of the inputs in order to convert it from a sinusoidal signal to TTL logic levels. The other input signal is derived from the VCO 65 on input line 60. The input to comparator 61 is then passed through an edge detector consisting of exclusive OR gate 62 and flip flop 64. The input on line 60 is passed through the edge detector consisting of exclusive OR gate 63 and flip flop 66. The two edge detectors produce a short ($\sim$35-50ns) positive pulse when the signal changes state (e.g. 0 to 1 or 1 to 0). In this circuit an input which differs from the state on the flip flop produces a positive signal from the exclusive OR gate. This signal in turn causes the flip flop to change state and changes the output of the exclusive OR gate again to zero. The edge detector circuitry provides a linear range of $\pi$ radians for the phase detector. Omitting the edge detector circuits is optional and results in a linear range of $2\pi$ radians.

The outputs of the edgte detector pass through NAND gates 67 and 68. The signal from NAND gate 67 driving up counter 69 and the signal from NAND gate 68 driving down counter 70. The outputs from counters 69 and 70 are added in adder 71 with the carry signal ignored. The most significant bit of the adder output is the phase detector output to be used in the phase locked loop and is 0 when the adder output is less than half of its range and is 1 when the adder is above midrange.

The output of the adder is applied to a decoder 78 which produces a zero to NAND gate 67 on the up counter 69 whenever the count on the adder rises to a prewired value (in FIG. 6 a value of 15 is shown). The decoder proudces a zero to NAND gate 68 on the down counter 70 whenever the count on the adder falls to a prewired value (in FIG. 6 a value of 0 is shown). A minimum of two stages is required for the up-down counters and for the adder in order to assure pull-in under all conditions. Increasing the number of stages does not interfere with pull-in but prolongs the pull-in transient due to increased cycle storage in the counters.

Extra states in the counters and adders permit the phase detector to store multiple cycles of phase error and to eventually recover phase data without loss. This capability allows previously impractical phase lock loops to be achieved allowing, for example, a loop with a very low bandwidth to track a rapidly changing frequency. It is for this capability that more than two stages would be desired for the counters and the adders. The extra stages allow tracking rate/bandwidth to be traded off against settling time.

Figure 7:
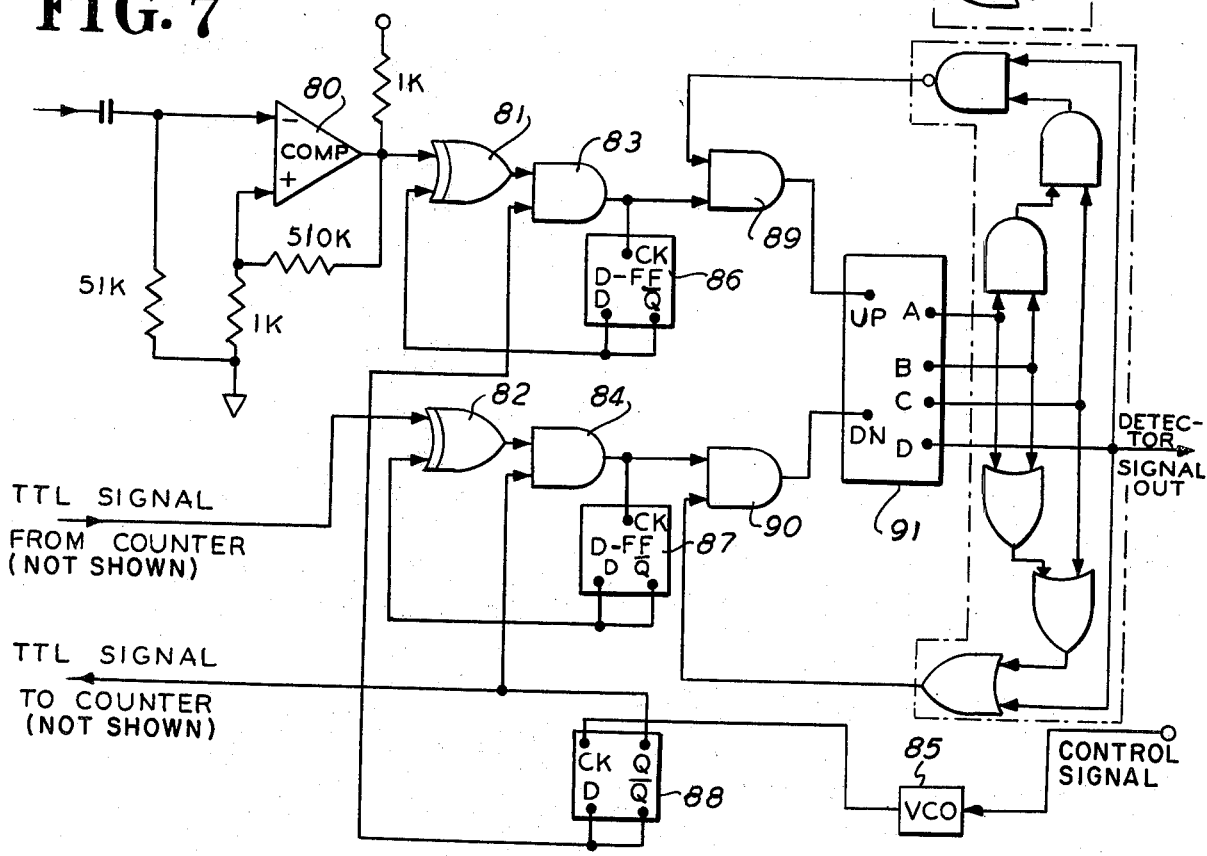
FIG. 7 is a second embodiment of the invention which substitutes a single UP/DOWN counter for the two counters and added combination of FIG. 6.

FIG. 7 shows a variation of the phase detector which substitutes a single up/down counter 91 for the two counters and adder of FIG. 6. The circuit configurations of FIG. 7 which are the same circuit configurations of FIG. 6 perform in the same manner. Counter stage 88 provides alternating signals to gates 83 and 84, which ensures that the up and down count signals to counter 91 do not interfere. The circuit combination of FIG. 7 requires that means 88 be provided in which the up and down counts are separated in time and do not interfere in the single up-down counter 91. Where the VCO 85 frequency is high compared to the incoming frequency, the up and down count pulses are readily separated in time.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A phase processing system comprising:

logic level pulse means for converting a sinusoidal signal input to logic level signal, a counting means, an adder means, driving means responsive to said logic level pulse means for driving said counting means, said counting means driving said adder means whereby the outputs of said counting means are added in said adder means with the carry signal ignored, the most significant bit from said adder means being 0 when said adding means is less than half its range and being 1 when the output of said adder means is above-mid-range, and decoding means for decoding the output of said adder means to block upcount when the adder output exceeds a first predetermined limit and to block downcount when the adder output falls below a second predetermined limit.

2. The phase processing system of claim 1 wherein said means for converting said sinusoidal signal input to logic level signals comprises a comparator.

3. The phase processing system of claim 2 wherein said driving means produces short positive pulses and comprises an edge detector consisting of a flip-flop circuit and an exclusive OR gate, said edge detector providing a linear range of $\pi$ radians for said phase processing system.

4. The phase processing system of claim 3 wherein said means for driving said counting means comprises NAND gates having inputs from said edge detector to drive an up counting means and a down counting means.

5. A phase processing system comprising:

a comparator for converting a sinusoidal signal input to a logic level signal, a voltage controlled oscillator, a first edge detector connected to the output of said comparator, a second edge detector connected to the output of said voltage controlled oscillator, said first and second edge detectors each comprising an exclusive OR gate and a flip-flop circuit, and producing a short positive pulse when said logic level signal and said voltage controlled oscillator change state, a first NAND gate connected to the output of said first edge detector, a second NAND gate connected to the output of said second edge detector, an up counter connected to the output of said first NAND gate, a down counter connected to the output of said second NAND gate, an adder circuit, said up counter and said down counter connected to said adder circuit whereby the outputs of said counters are added in said adder circuit and the most significant bit from said adder circuit being zero when said adder circuit output is less than half its range and being one when the output of said adder circuit is above mid-range, and a decoder circuit connected to the output of said adder circuit to block upcount when adder output exceeds a first predetermined limit and to block downcount when adder output falls below a second predetermined limit.

6. A phase processing system comprising:

a source of logic level signal inputs, means responsive to said logic level signal inputs for producing positive pulses as said logic level signals change their state, a first counting means for separating time periods, a second counting means controlled by said first counting means and connected to said means for producing positive pulses for counting up said pulses during an up counting period and for counting down during a down counting period, and decoding means for decoding the output of said second counting means to block upcount when the second counter output exceeds a first predetermined limit and to block downcount when the second counter output falls below a second predetermined limit.

7. The phase processing system of claim 6 comprising:

means for converting sinusoidal signals into said logic level signals.

8. The phase processing system of claim 7 wherein said means responsive to said logic level inputs comprises an edge detector comprising an exclusive OR gate, a NAND gate and a flip flop circuit.

9. The phase processing system of claim 8 comprising NAND gates connected to said edge detector and said decoding means for driving said counting means.

10. A phase processing system comprising:

a comparator for converting a sinusoidal signal input into a logic level signal, a voltage controlled oscillator, a first edge detector connected to the output of said comparator, a second edge detector connected to the output of said voltage controlled oscillator, an up/down counter connected to said first and second edge detectors, and a decoder connected to said up/down counter whereby the phase error output signal of said phase processing system is made to rapidly follow the phase difference of the input signals.

11. A phase processing system comprising:

means for converting a sinusoidal signal input to logic level signal, a counting means, an adder means, said counting means driving said adder means whereby the outputs of said counting means are added in said adder means with the carry signal ignored, the most significant bit from said adder means being 0 when said adding means is less than half its range and being 1 when the output of said adder means is above mid-range, and decoding means for decoding the output of said adder means to block upcount when the adder output exceeds a first predetermined limit and to block downcount when the adder output falls below a second predetermined value.

* * * * *